(12) United States Patent
Harvey

(10) Patent No.: US 8,938,280 B2
(45) Date of Patent: Jan. 20, 2015

(54) MOTION CORRECTION IN A PET/MRI HYBRID IMAGING SYSTEM

(75) Inventor: Paul Harvey, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 407 days.

(21) Appl. No.: 12/519,863

(22) PCT Filed: Dec. 13, 2007

(86) PCT No.: PCT/IB2007/055080
§ 371 (c)(1),
(2), (4) Date: Jun. 18, 2009

(87) PCT Pub. No.: WO2008/075265
PCT Pub. Date: Jun. 26, 2008

(65) Prior Publication Data
US 2010/0106004 A1    Apr. 29, 2010

(30) Foreign Application Priority Data

Dec. 19, 2006  (EP) .................................... 06126443

(51) Int. Cl.
*A61B 5/05*      (2006.01)
*G01R 33/565*    (2006.01)
*G01R 33/48*     (2006.01)

(52) U.S. Cl.
CPC ........ *G01R 33/56509* (2013.01); *G01R 33/481* (2013.01)
USPC ........... 600/410; 600/411; 600/407; 600/436; 600/427

(58) Field of Classification Search
None
See application file for complete search history.

(56) References Cited

U.S. PATENT DOCUMENTS

| 4,939,464 | A | * | 7/1990 | Hammer | 324/318 |
| 5,200,700 | A | * | 4/1993 | Glover et al. | 324/309 |
| 5,247,935 | A | * | 9/1993 | Cline et al. | 600/411 |
| 5,251,128 | A | * | 10/1993 | Crawford | 600/425 |
| 5,287,276 | A | * | 2/1994 | Crawford et al. | 378/4 |
| 6,088,611 | A | * | 7/2000 | Lauterbur et al. | 600/407 |
| 6,374,132 | B1 | * | 4/2002 | Acker et al. | 600/411 |

(Continued)

FOREIGN PATENT DOCUMENTS

| CN | 1644162 A | 7/2005 |
| CN | 2815414 Y | 9/2006 |

(Continued)

OTHER PUBLICATIONS

Anderson et al., "A Method for Coregistration of PET and MR Brain Images", J Nucl Med. 1995; 36:1307-1315.*

(Continued)

*Primary Examiner* — Nicholas Evoy

(57) ABSTRACT

A diagnostic imaging arrangement comprises a magnetic resonance examination (1) system to acquire magnetic resonance signals and an emission tomography system (2) to acquire nuclear decay signals. An analysis module (4) is provided to derive motion correction(s) from the magnetic resonance signals. A reconstruction module (5) reconstructs a motion corrected emission tomographic image from the nuclear decay signals on the basis of the motion correction. Also a therapeutic arrangement is disclosed with a diagnostic imaging arrangement and a therapy module, with a system controller is further coupled to the therapy module and has the function to control the therapy module on the basis of image information generated by the diagnostic imaging system.

11 Claims, 5 Drawing Sheets

(56) References Cited

U.S. PATENT DOCUMENTS

| | | | |
|---|---|---|---|
| 6,377,833 B1* | 4/2002 | Albert | 600/410 |
| 6,490,476 B1* | 12/2002 | Townsend et al. | 600/427 |
| 6,631,284 B2* | 10/2003 | Nutt et al. | 600/427 |
| 6,892,090 B2* | 5/2005 | Verard et al. | 600/424 |
| 6,946,841 B2* | 9/2005 | Rubashov | 324/318 |
| 7,286,867 B2* | 10/2007 | Schlyer et al. | 600/407 |
| 7,477,057 B2* | 1/2009 | Baumgartl et al. | 324/322 |
| 7,667,457 B2* | 2/2010 | Linz et al. | 324/307 |
| 8,064,981 B2* | 11/2011 | Eberler et al. | 600/407 |
| 8,401,613 B2* | 3/2013 | Choi et al. | 600/411 |
| 8,638,095 B2* | 1/2014 | Fenchel et al. | 324/309 |
| 2003/0004405 A1* | 1/2003 | Townsend et al. | 600/407 |
| 2003/0090267 A1* | 5/2003 | Rubashov | 324/318 |
| 2004/0030246 A1* | 2/2004 | Townsend et al. | 600/427 |
| 2004/0167390 A1* | 8/2004 | Alexander et al. | 600/410 |
| 2005/0113667 A1* | 5/2005 | Schlyer et al. | 600/411 |
| 2005/0165294 A1* | 7/2005 | Weiss | 600/410 |
| 2005/0285857 A1* | 12/2005 | Bonnet et al. | 345/420 |
| 2006/0052685 A1* | 3/2006 | Cho et al. | 600/407 |
| 2006/0074292 A1* | 4/2006 | Thomson et al. | 600/411 |
| 2006/0074296 A1* | 4/2006 | Dumoulin et al. | 600/424 |
| 2006/0084858 A1* | 4/2006 | Marks | 600/407 |
| 2006/0145696 A1* | 7/2006 | Fuderer et al. | 324/309 |
| 2006/0232273 A1 | 10/2006 | Takizawa | |
| 2006/0250133 A1* | 11/2006 | Krieg et al. | 324/318 |
| 2006/0251312 A1* | 11/2006 | Krieg et al. | 382/131 |
| 2006/0293580 A1* | 12/2006 | Ladebeck et al. | 600/407 |
| 2008/0146914 A1* | 6/2008 | Polzin et al. | 600/420 |
| 2008/0287772 A1* | 11/2008 | Declerck et al. | 600/411 |
| 2010/0010337 A1* | 1/2010 | Hagen et al. | 600/411 |
| 2010/0290683 A1* | 11/2010 | Demeester et al. | 382/131 |
| 2012/0035461 A1* | 2/2012 | Schmidt | 600/411 |
| 2012/0169341 A1* | 7/2012 | McKinnon | 324/318 |
| 2012/0268118 A1* | 10/2012 | Fenchel et al. | 324/307 |
| 2013/0027040 A1* | 1/2013 | Alagappan et al. | 324/322 |
| 2013/0131493 A1* | 5/2013 | Wollenweber et al. | 600/411 |
| 2013/0320973 A1* | 12/2013 | Fenchel et al. | 324/309 |
| 2013/0322715 A1* | 12/2013 | Wollenweber et al. | 382/131 |

FOREIGN PATENT DOCUMENTS

| | | |
|---|---|---|
| EP | 0558029 B1 | 4/2002 |
| JP | 2002165774 A | 6/2002 |
| JP | 2004344672 A | 7/2004 |
| JP | 2005160553 A | 6/2005 |
| WO | 2006051911 A1 | 5/2006 |

OTHER PUBLICATIONS

Bendriem, B.; Recent Innovations in PET and hybrid modality technologies; 2006; 9th SAC Seminar on New Trends on Positron Emission Tomography; pp. 33-36.

Focal Point; The Fusion Menu Expands—PET/MRI Hybrid Imaging; 2006; Imaging Technology News; http://new.reillycom.com/imaging/article.

Lucas, A. J., et al.; Development of a Combined microPET-MR System; 2006; Technology in Cancer Research and Treatment; 5(4)337-341.

Marsden, P. K., et al.; Simultaneous PET and NMR; 2002; The British Journal of Radiology; 75:S53-S59.

Pipe, J. G.; Motion correction with Propeller MRI: Application to Head Motion and Free-Breathing Cardiac Imaging; 1999; MRM; 42:963-969.

Schwaiger, M., et al.; MR-PET: Combining Function, Anatomy, and More; 2005; Medical Solutions; pp. 25-30.

Sechet, S., et al.; Fame misalignment-induced errors in PET studies: an investigation on strategies for correction; 2003; IEEE Trans. on Nuclear Science; vol. 2: 1330-1334.

UC Davis Office of Research; Integrated PET-MRI Scanner for Simultaneous Imaging; 2005-584; http://www.research.ucdavis.edu/ncd.cfm.

\* cited by examiner

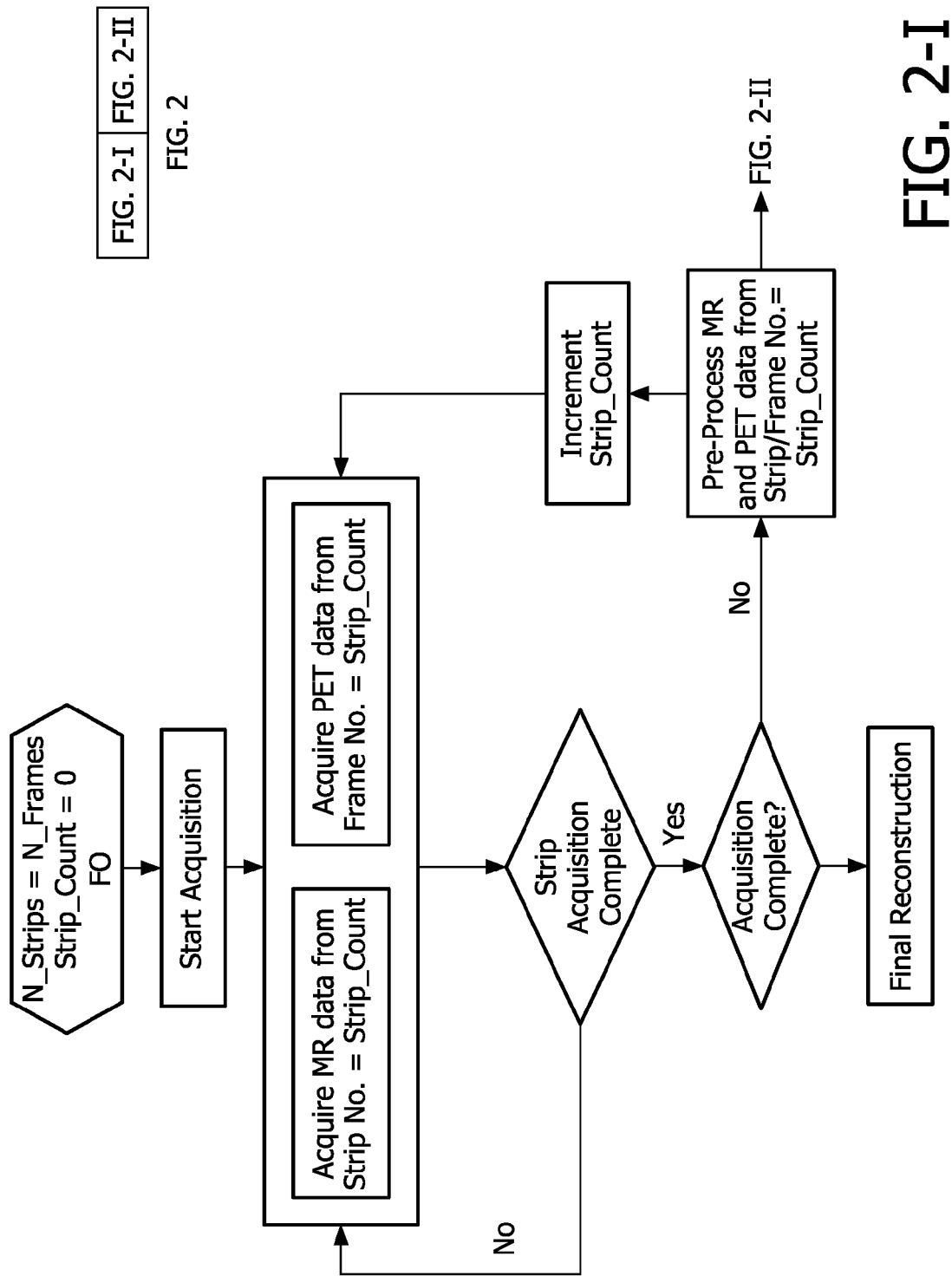

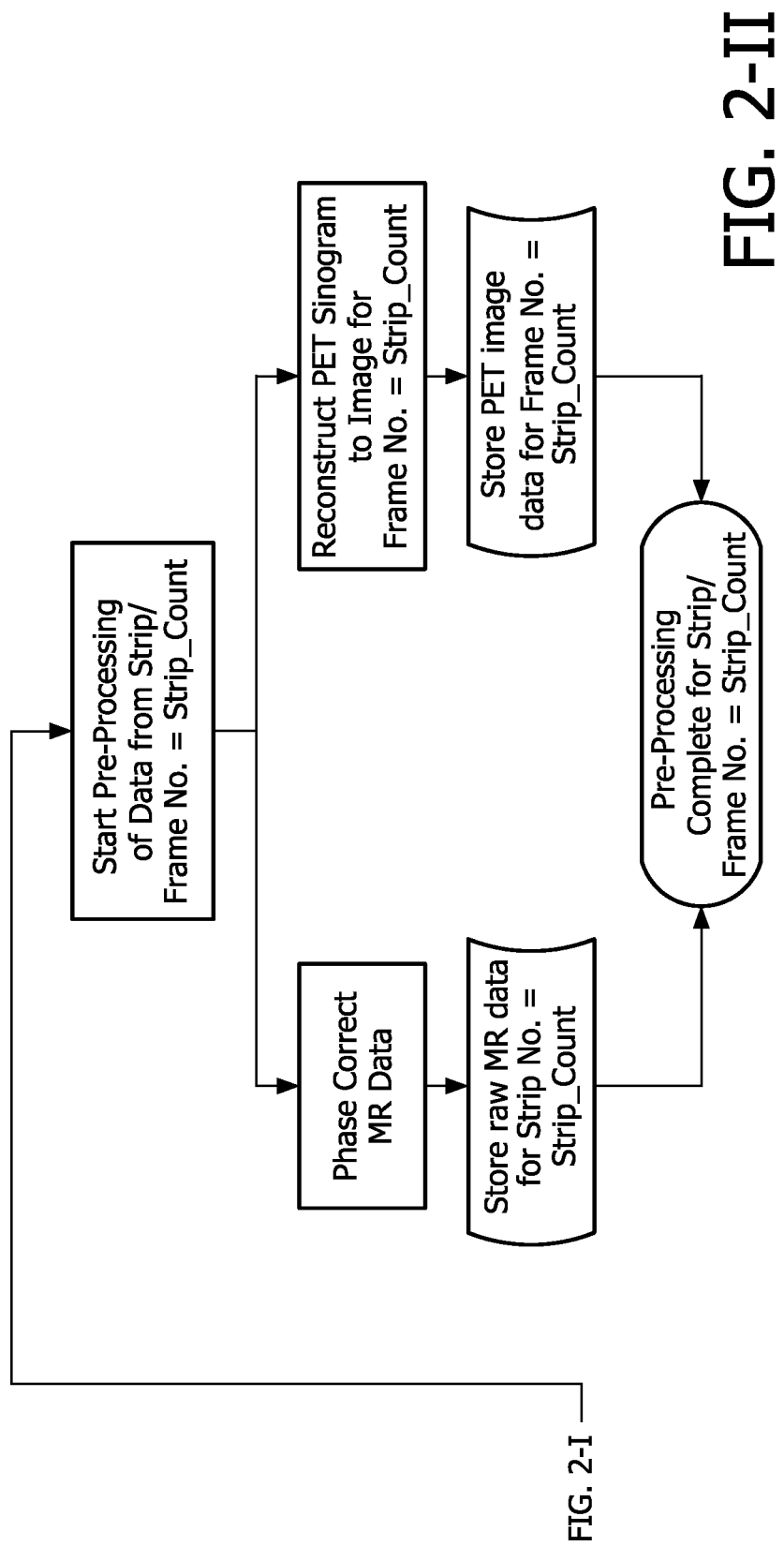
FIG. 2-II

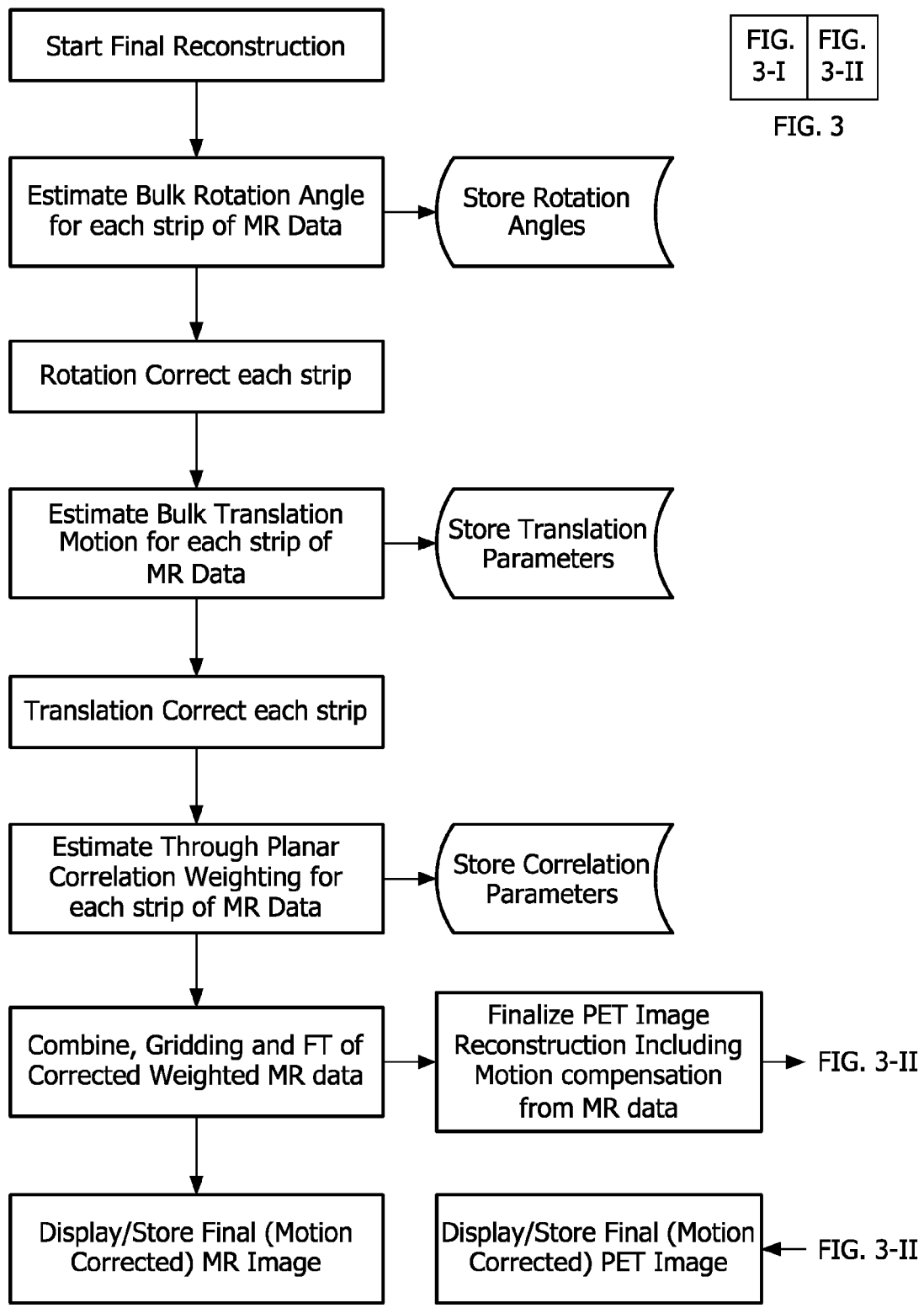
FIG. 3-I

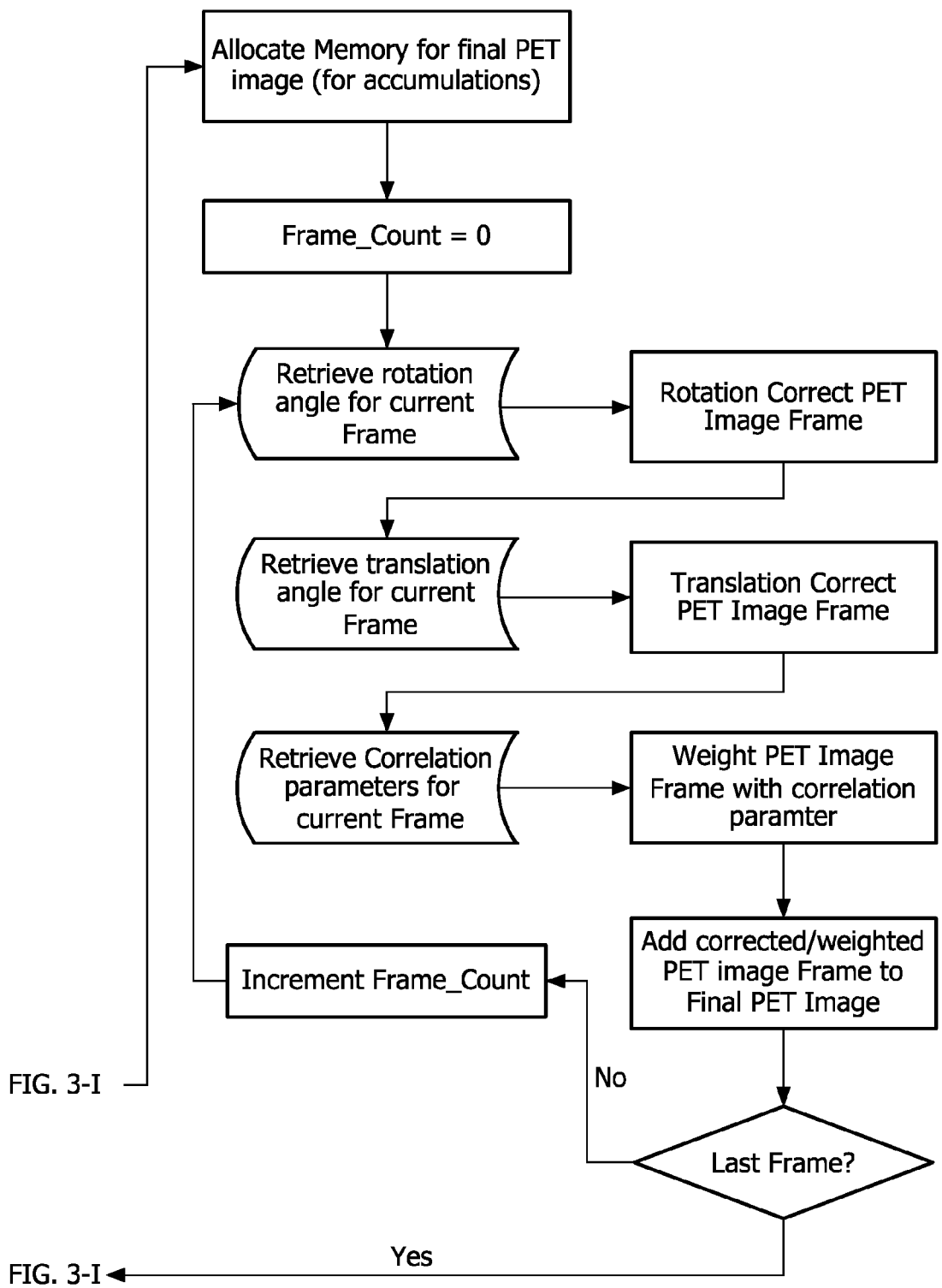
FIG. 3-II

MOTION CORRECTION IN A PET/MRI HYBRID IMAGING SYSTEM

FIELD OF THE INVENTION

The invention pertains to a diagnostic imaging arrangement comprising a magnetic resonance examination system and an emission tomography system.

BACKGROUND OF THE INVENTION

A diagnostic imaging arrangement which includes positron emission tomography (PET) and magnetic resonance imaging (MRI) is known from the paper 'Frame misalignment-induced errors in PET studies: an investigation on strategies for correction' by S. Sechet et al in the Nuclear Science: A Symposium Conference Record November 2002 Vol. 2 pp. 1330-1334.

The cited reference concerns the problem of motion artefacts that can corrupt data analysis in a PET study. The known approach creates an artificial PET transmission image for the 3D target from the reconstructed magnetic resonance image. The artificial PET transmission image derived from the magnetic resonance image mimics the spatial response of the PET system. Then a frame alignment algorithm is applied between the PET transmission image and a PET emission image to align the transmission and emission images.

This known approach is limited in that only mis-registration between transmission and emission data is taken into account. Moreover, the known approach requires a large computational effort in reconstruction of various (intermediate) images.

SUMMARY OF THE INVENTION

An object of the invention is to provide positron emission tomography in which motion artefacts are better corrected for without the need of a massive computational effort.

This object is achieved by a diagnostic imaging arrangement according to the invention which comprises

- a magnetic resonance examination system to acquire magnetic resonance signals
- an emission tomography system to acquire nuclear decay signals and
- an analysis module to derive motion correction(s) from the magnetic resonance signals and
- a reconstruction module to reconstruct a motion corrected emission tomographic image from the nuclear decay signals on the basis of the motion correction(s).

The emission tomography system, such as for example a positron emission tomography (PET) system or a single photon emission tomography (SPECT) system detects the emission of radioactive decay of a compound in the object to be examined. Detection of radioactive decay generates nuclear decay signals which are acquired by the emission tomography system. The nuclear decay signals represent detected radioactive emission from a plurality of orientations. The magnetic resonance examination system acquires magnetic resonance signals which are generated by RF excitation of (nuclear or electron) spins in the object. That is, the magnetic resonance signals may relate to magnetic resonance of a nuclear spin, such as proton, $^{19}F$, $^{31}P$, etc, or an electron spin resonance. Upon decay of the excited spins, the magnetic resonance signals are acquired by scanning of k-space. That is, the magnetic resonance signals are acquired by scanning the wavevector (k-vector) of the magnetic resonance signals. An insight of the invention is that the magnetic resonance signals include information on motion that occurs in or of the object to be examined. The object may be a patient to be examined and motion may pertain to motion of the patient's body as a whole or part of the patient's body, such as movements of the patient's head in a brain examination. Motion may also be internal motion within the patient's body such as respiratory or cardiac motion. The motion correction can be derived from the magnetic resonance signals without having to reconstruct a magnetic resonance image from the acquired magnetic resonance signals. On the basis of the motion correction and the nuclear decay signals a motion corrected emission tomographic image is reconstructed. This motion corrected emission tomography image has a low artefact level, or is even free of motion artefacts, so that a high diagnostic image quality is achieved. That is, small details with low contrast are rendered well visible and are notably not obscured by motion artefacts.

The acquisition of both the nuclear decay signals and the magnetic resonance signals is controlled by a system controller that is common to the emission tomography system and the magnetic resonance examination system. The common system controller enables to link the nuclear decay signals and the magnetic resonance signals in that a definite relationship between nuclear decay signals and magnetic resonance signals is established. That is, the motion information contained in the magnetic resonance signals is equal to motion that affects the nuclear decay signals. This relationship between the magnetic resonance signals and the nuclear decay signals enables that motion derived from the magnetic resonance signals can be applied to reconstruct the motion corrected emission tomographic image. The motion correction may be performed by applying the motion correction to the acquired nuclear decay signals and then reconstruct the motion corrected emission tomographic image from the corrected nuclear decay signals. Alternatively, a primary emission tomographic image can be reconstructed from the acquired nuclear decay signals and then apply the motion correction to the primary emission tomographic image to produce the motion corrected emission tomography image.

These and other aspects of the invention will be further elaborated with reference to the embodiments defined in the dependent Claims.

According to one aspect of the invention, the time of acquisition, i.e. the instant or temporal position of the time interval is registered at which or during which the nuclear decay signals and the magnetic resonance signals, respectively, are acquired. This time registration of the acquisition of the nuclear decay signals and the magnetic resonance signals can be achieved for example by simultaneously acquiring corresponding nuclear decay signals and magnetic resonance signals or by effecting a time-stamp to both the nuclear decay signals and the magnetic resonance signals. Thus, the motion correction derived from the magnetic resonance signals can be applied to the nuclear decay signals that were acquired at the same instant. Accordingly, the motion correction derived from the magnetic resonance signals pertains to the same motion that affected the nuclear decay signals and accurate motion correction of the motion corrected emission tomographic image is achieved. It is convenient to implement the time registration function in the system controller.

The nuclear decay signals are often generated by administering a radiopharmaceutical to the patient to be examined. Upon administration, the radiopharmaceutical will radioactively decay from within the body of the patient and cause the emission of radioactive radiation (usually gamma radiation) from the body of the patient to be examined. Because nuclear decay signals can be acquired from the instant of administering the radiopharmaceutical, triggering the acquisition of the nuclear decay signals and magnetic resonance signals provides a time efficient acquisition of nuclear decay signals having a relatively high signal level.

According to another aspect of the invention, the motion correction is also employed to reconstruct a motion corrected magnetic resonance image on the basis of the acquired magnetic resonance signals. Then, the motion corrected emission tomographic image and the motion corrected magnetic resonance image can be viewed together. Often, the motion corrected emission tomography image and the motion corrected magnetic resonance image represent complementary physiological and/or anatomic morphological information. The motion corrected emission tomography image and the motion corrected magnetic resonance image can be made available separately and e.g. be shown simply side-by-side. The complementary information may also be combined into one combined image so that the user needs to view only a single image to take in the image information from the respective nuclear decay and magnetic resonance origin.

Motion correction is accurate and without the need for a high computational effort on the basis of redundancy of MR data in the centre region of k-space. Namely, most relevant motion occurs on a spatially coarse scale, i.e. involving sizes much larger than the fine details of the patient's anatomy. Accordingly, larger scale structures and their motion are represented by magnetic resonance signals in the centre region of k-space. On the other hand fine details of structures are represented by magnetic resonance signals from the peripheral region of k-space. The size of the centre region in which redundancy is generated may be selected by the user on the basis of the required accuracy of the motion correction and the acceptable time duration of the acquisition of the magnetic resonance signals. Very good results are achieved by the so-called PROPELLER acquisition sequence. The PROPELLER acquisition sequence per se is discussed in detail in 'Motion correction with PROPELLER MRI: Application to Head Motion and Free-breathing Cardiac Imaging' in MRM42(1999)963-969 by James G. Pipe. In this paper motion correction of the magnetic resonance image itself reconstructed from the acquired magnetic resonance signals is discussed. The PROPELLER method scans k-space along rectangular planar (i.e. in a plane or thin slab in k-space) strips that are successively rotated about the origin of k-space. This 2D acquisition may be repeated for successive planes in k-space. This approach requires a relatively short acquisition time. Alternatively, a truly three-dimensional k-space acquisition may be carried out by applying a phase-encoding in the k-space direction transverse to the rotating plane or thin slab. Another truly three-dimensional k-space acquisition involves to rotate a column or bar-shaped volume that contains the origin of k-space about two e.g. orthogonal axes in k-space simultaneously. Accordingly the central region of k-space is sampled for successive individual strips. The central region is in this implementation formed by the overlap of the successive individual strips and the size of the central region is defined by the width of the strips or column or bar-shaped volume in k-space and the differences between the orientations of the strips in k-space. The redundancy of the magnetic resonance signals sampled from the control region of k-space allows notably to correct spatial inconsistencies in position, rotation and phase. Also the redundancy allows to reject data affected by through-plane motion. Further, the redundancy allows averaging which decreases artefacts for low spatial frequencies in the motion corrected magnetic resonance images. Because the PROPELLER acquisition sequence is cyclic in nature, continued acquisition of magnetic resonance signals is possible by performing multiple rotations of the strip(s) in k-space. Continued acquisition of the magnetic resonance signals allows to increase the signal-to-noise ratio of the ultimately reconstructed magnetic resonance image. Continued acquisition of nuclear decay signals achieves improvement of both the signal-to-noise ratio as well as the spatial resolution of the reconstructed emission tomography image.

The invention further pertains to a therapeutic arrangement in which a therapeutic system is functionally combined with the diagnostic arrangement according to the invention, notably as defined in any one of Claims 1 to 8. The magnetic resonance examination system provides information on the anatomical morphology or the local temperature distribution of the patient to be examined. The emission tomography system provides functionality information on local metabolism. Moreover, according to the invention, motion correction is applied to the functionality information on local metabolism and/or the anatomical morphology information. On the basis of these motion corrected information, the therapeutic system is controlled. That is, the application of the therapeutic activity, notably the location where the therapeutic activity is effected and/or the intensity or duration of the therapeutic activity is controlled on the basis of the motion corrected information from the magnetic resonance examination system and the emission tomography system. The therapeutic system may be implemented for example as a high-intensity ultrasound (HIFU) system. The HIFU system generates a high intensity ultrasound intensity in a local (focus) region which alters or destroys tissue locally. The diagnostic imaging arrangement has the capability to localize a lesion, notably a malignant tumor, on the basis of the combination of anatomical information and local metabolism. Then the therapeutic system is controlled to apply the therapeutic action, such as the high-intensity focused ultrasound radiation, accurately to the lesion. Further, the diagnostic imaging arrangement is able to monitor the effect of the therapeutic action, e.g. by way of magnetic resonance thermography. Magnetic resonance thermography is known per se from the paper of J. de Poorter, 'Noninvasive MRI Thermometry with the proton resonance frequency (PRF) method: In Vivo results in human muscle', Magnetic Resonance Imaging 33 (1995), p 74-81

In another example of the diagnostic imaging arrangement of the invention the emission tomography system includes a high-energy detector to receive nuclear decay signals. The magnetic resonance examination system includes both gradient coils to generate magnetic gradient encoding fields. The magnetic resonance examination system also includes RF antennae to transmit and/or receive magnetic resonance signals. Both the RF antennae and the high-energy detector are located around a examination zone in which a patient to be examined can be positioned. The RF antennae and the high-energy detector may be integrated so that both the RF antennae as well as the high-energy detector are relatively close to the patient to be examined without compromising the size, notably the width, of the examination zone. Because the RF antennae is close to the patient to be examined, the spatial distribution of the RF excitation field within the patient to be examined can be well controlled so that adequate excitation of the spins is achieved without causing an unnecessary RF (SAR) burden to the patient to be examined. Also magnetic resonance signals are more sensitively detected by the RF antennae close to the patient to be examined. In addition the nuclear decay signals are sensitively detected by the high-energy detector close to the patient to be examined.

BRIEF DESCRIPTION OF THE DRAWINGS

These and other aspects of the invention will be elucidated with reference to the embodiments described hereinafter and with reference to the accompanying drawing wherein FIG. 2 shows, in the form of a flow chart, control, data flow and processing performed by the diagnostic imaging arrangement of the invention and FIG. 3 shows, in the form of a flow chart the data processing to motion correct nuclear emission decay data (PET data) using simultaneously acquired magnetic resonance signals (MRI data) according to the invention.

DETAILED DESCRIPTION OF THE EMBODIMENTS

Figure 1:
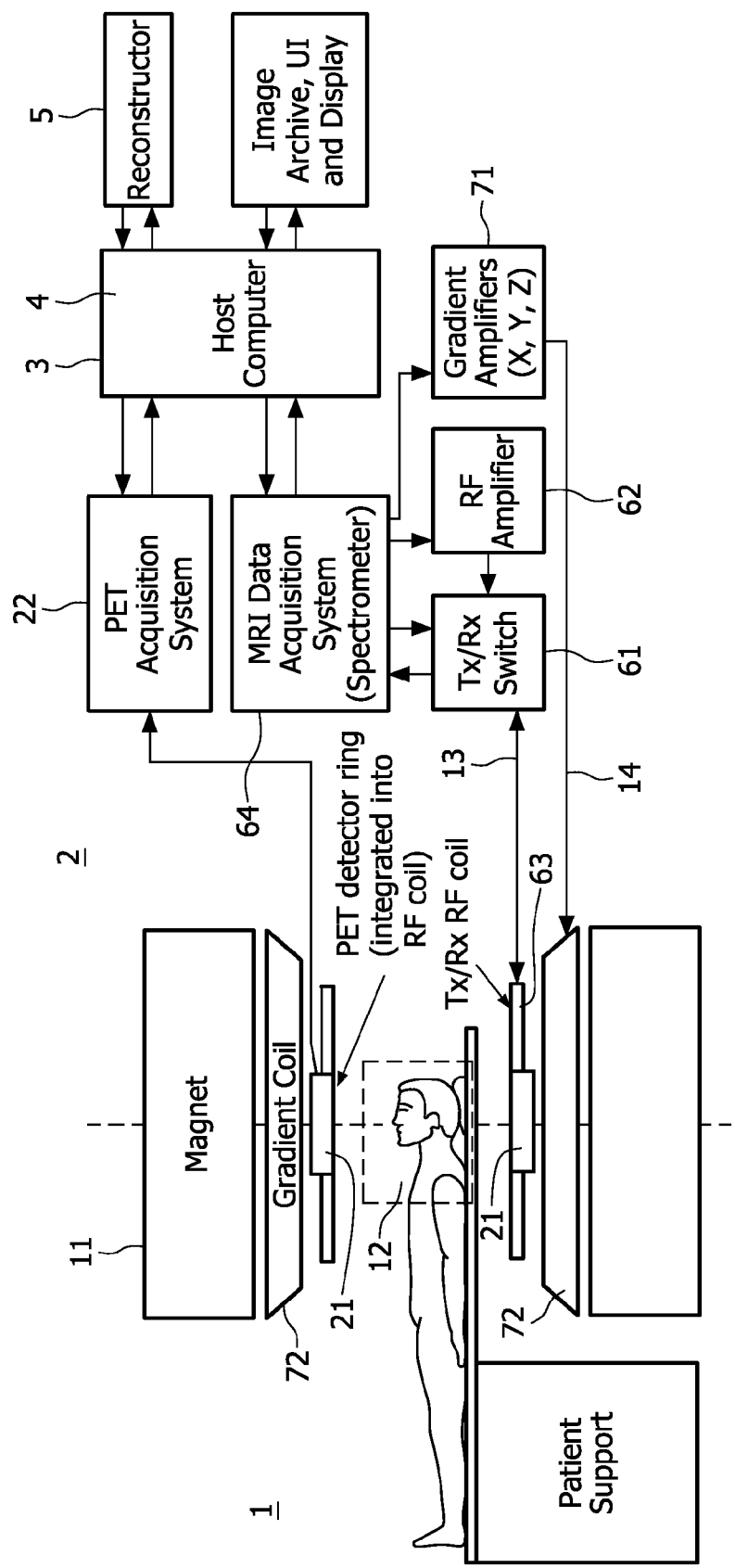
FIG. 1 shows a schematic representation of an embodiment of the diagnostic imaging arrangement according to the invention.

FIG. 1 shows a schematic representation of an embodiment of the diagnostic imaging arrangement according to the invention. The diagnostic imaging arrangement comprises an magnetic resonance examination system 1 and a emission tomography system 2 that is in fact a PET scanner 2. The magnetic resonance examination system comprises a main magnet 11 which generates a steady homogeneous main magnetic field within the examination zone 12. This main magnetic field causes a partial orientation of the spins in the patient to be examined along the field lines of the main magnetic field. An RF system 13 is provided with one or more RF antennae 63 to emit an RF excitation electromagnetic field into the examination zone to excite spins in the body of the patient to be examined. The relaxing spins emit magnetic resonance signals in the RF range which are picked up by the RF antennae, notably in the form of RF receiving coils. The RF system has the function of transmission (Tx) of the RF excitation field as well as receiving the magnetic resonance signals. The same hardware may be employed for transmission and receiving. A Tx/Rx switch 61 is provided to switch between RF excitation and signal acquisition. Further, separate surface coils may be used as local RF receiver antennae. For transmission also local coils may be employed. Notably, a local surface coil or a local volume coil (i.e. a T/R birdcage head coil) can be employed to generate and receive the magnetic resonance signals from the relevant portion of the patient's anatomy. That is, the magnetic resonance examination system of the present inventions does not necessarily require a fixed MR body coil provided another coil is available for excitation of spins and receipt of magnetic resonance signals. An RF amplifier system 62 is coupled to the Tx/Rx switch 61 and has the function to apply RF waveforms to the RF antennae 63. Further, gradient coils 14 are provided to generate temporary magnetic gradient fields, notably read gradient pulses and phase encoding gradients. These gradient fields usually are orientated in mutual orthogonal directions and impose spatial encoding on the magnetic resonance signals. Gradient amplifiers 71 are provided to activate the gradient coils 72 to generate the magnetic gradient encoding fields. The gradient amplifiers 71 together with the gradient coils 72 form a gradient system 14 The magnetic resonance signals picked up by the RF receiver antennae are applied to an MRI data acquisition system (MRI-DAS) which includes a spectrometer.

The emission tomography system, in this example a PET scanning system 2 comprises a PET detector ring which is located around the examination zone to pick up nuclear decay signals from the patient to be examined. Notably, the PET detector ring and the RF antennae are arranged to be sensitive to the same volume of interest and are e.g. located around the same volume of interest. In particular the centre of the PET detector ring coincides with the centre of the examination zone 12. Notably, the PET detector ring is integrated with the RF coil 63. For example, the PET detector has detector elements that are sensitive for gamma radiation and that are nested between conductor rods of the RF coil. For example, the RF coil 63 is made of thin strips that are located between the detector elements of the PET detector. The detector elements are formed by individual detector crystals. In this way the conductor rods of the RF coil provide mechanical support for the PET detector elements. On the other hand the PET detectors do hardly or not at interfere with the function of the RF coil and vice versa. The PET detector ring 21 integrated with the RF coil is located in front of the gradient coils, as seen from the examination zone. I.e. the PET detector with RF coil is located closer to the patient to be examined than the gradient coils. This achieves that the PET detector ring 21 as well as the RF antennae (coil) have their respective spatial regions of high sensitivity in the examination zone 12. Because the detector crystals are not significantly electrically conductive, they can operate within the gradient coil with adversely affecting the gradient field. Further, the detector electronics is made of semi-conductor components are mounted in such a way that eddy currents induced by operation of the gradient coil are minimized. The nuclear decay signals received by the PET detector ring 21 are converted into electronic decay signals (PET data) that are routed to a PET acquisition system 22. The PET acquisition system acquires the PET data directly into so-called sinograms.

Individual detector pairs have associated with them a respective line-of-response which connects the separate detectors of the pair at issue. The line-of-response is specified by its angle of orientation and the shortest distance between the line-of-response and the centre of the PET detector ring. For an individual coincidence event a plurality of lines-of-response are formed and their angles and orientations are collected which, when plotted leads to a sine-shaped curve for the coincidence at issue (hence the term sinogram). From the angle of orientation and the shortest distance (between the line-of-response and the centre of the PET detector ring) of the sinogram of the coincidence event its location can be determined. For several coincidence events angels and orientations of the respective lines-of-response are collected as pixels in the sinogram, so that finally an individual pixel in the sinogram represents the number of coincidence events associated with its line-of-response, or equivalently a pair of (opposite) detector orientations. From the final sinogram an image can be reconstructed by e.g. a filtered back projection. To reconstruct PET images from the PET data, notably the sinogram and to reconstruct the magnetic resonance image from the magnetic resonance signals a reconstructor 5 is provided. Usually, the reconstructor 5 is implemented in software.

The magnetic resonance examination system excites spins in the object to be examined and positioned in the examination zone by applying an RF-excitation field by way of the RF-antenna, notably the RF coil 63. The RF coil is activated by the RF amplifier 62 and operating the Tx/Rx switch in the transmit mode. Owing to the RF excitation, relaxing of the excited spins causes magnetic resonance signals from the object. The magnetic resonance signals are received by the RF coil and applied to the MRI to scan k-space for the acquisition of the magnetic resonance signals. By applying encoding gradients, k-space is scanned and the received MRI data are applied to the MRI-DAS 64 and ultimately to the reconstructor 5. The host computer 3 controls the RF system 13 and the gradient system 14 so as to carry out a suitable acquisition sequence to scan k-space for the acquisition of the magnetic resonance signals. In particular the magnetic resonance examination system performs a PROPELLER type acquisition sequence which scans the centre region of k-space redundantly. This redundant scanning implies that the same centre region of k-space is sampled successively several times. If no motion occurs the successive samples are essentially equal. Accordingly, variation of the successive samples from the centre of k-space represents changes e.g. due to motion having occurred during the successive sampling. In particular, motion correction parameters are evaluated for each strip scanned in k-space. These parameters concern notably rotation, translation and through plane weighting. Also other acquisition sequences which redundantly sample the centre region of k-space may be employed. Particular examples of acquisition sequences that operate in a satisfactory way to achieve redundancy in the centre of k-space are 3D-TRICKS which involves a periodic re-scanning of the centre of k-space; also good results are achieved with 4D-TRACKS which involves to start scanning from a position off the centre of k-space to acquire signals with maximum contrast enhancement from the centre of k-space and employs different acquisition approaches in a centre and peripheral region of k-space, respectively. Also, parallel imaging techniques may be combined with these acquisition sequences.

Acquired PET and MRI data are 'time stamped' binned into frames corresponding to the time required for the acquisition of magnetic resonance signals from an individual strip in k-space. The magnetic resonance signals can be acquired simultaneously with the PET data acquisition. Then for individual PET sinograms, respective strips in k-space are acquired. When the next strip rotated in k-space of magnetic resonance signals is acquired, the simultaneously acquired PET data is stored as a new frame associated with the newly rotated strip in k-space The analysis unit 4 is incorporated in the host computer, notably as a software module. The analysis unit 4 derives the required motion correction from the sampled data from the redundantly scanned centre region of k-space. The motion correction derived from the magnetic resonance signals is applied to the simultaneously acquired PET data. In particular the individual PET sinograms are processed, i.e. reconstructed to individual PET image frames which are subsequently corrected for motion. The motion corrections can be applied to individual sinograms before projection reconstruction. The required corrections are translated from the spatial domain into the sinogram space. Subsequently, the motion corrected PET image frames are reconstructed (e.g. by weighted summation) into the motion corrected PET image. Alternatively, motion correction may be applied to the individual PET image frames which includes rotations and distortions of the image frame geometry. Further, corrections for through-plane motion may also include weighting of the individual PET image frame on a pixel-by-pixel basis FIG. 2 shows a flow diagram for the simultaneous acquisition and pre-processing of magnetic resonance signals (MRI data) and nuclear decay signals (PET data). The MRI data are acquired in a manner that makes it appropriate for motion correction of both the MRI and PET data and the images reconstructed from these acquired data.

FIG. 3 shows a flow diagram for the reconstruction following the completion of acquisition of all (MRI and PET) data that are employed to reconstruct a motion compensated magnetic resonance image and a motion compensated emission tomographic image (PET image)

The invention claimed is:

1. A diagnostic imaging system comprising:
a magnetic resonance examination system configured to generate magnetic resonance image data and magnetic resonance motion data by performing a magnetic resonance sequence in which spins are excited and encoding gradients are applied to scan k-space to generate the magnetic resonance image data and to repeatedly and redundantly scan a center of k-space to generate the magnetic resonance motion data;
an emission tomography system configured to generate nuclear decay data;
one or more computer processors configured to:
control (1) the magnetic resonance examination system and the emission tomography system to generate the magnetic resonance image data and the nuclear decay data simultaneously and (2) the magnetic resonance examination system to repeatedly and redundantly scan the center of k-space and time stamp and bin the magnetic resonance image data and the nuclear decay data into frames corresponding to a temporal interval between repetitions of the scanning of the center of k-space to generate the magnetic resonance motion data;
derive a motion correction from the repeated and redundant scans of the center of k-space of the magnetic resonance motion data; and
correct the nuclear decay data in accordance with the derived motion correction and to reconstruct a motion corrected emission tomographic image from the motion corrected nuclear decay data.

2. A diagnostic imaging system comprising:
a magnetic resonance examination system configured to generate magnetic resonance data by performing a magnetic resonance sequence in which spins are excited and encoding gradients are applied to scan k-space to generate the magnetic resonance data;
an emission tomography system configured to generate nuclear decay data;
a system controller configured to:
control (1) the magnetic resonance examination system and the emission tomography system to generate the magnetic resonance data and the nuclear decay data simultaneously and over an equal acquisition time and (2) the magnetic resonance examination system to repeatedly and redundantly acquire the magnetic resonance data from a central portion of k-space to generate magnetic resonance motion data;
derive a motion correction from the magnetic resonance motion data;
correct the nuclear decay data in accordance with the derived motion correction; and
reconstruct a motion corrected emission tomographic image from the motion corrected nuclear decay data.

3. The diagnostic imaging system as claimed in claim 1, wherein the one or more computer processors are further configured to assign time stamps to the magnetic resonance image data, magnetic resonance motion data, and the nuclear decay data.

4. The diagnostic imaging system as claimed in claim 1, wherein the one or more computer processors are further configured to trigger the magnetic resonance examination system and the emission tomography system based on administering a radio pharmaceutical to an object to be examined.

5. The diagnostic imaging system as claimed in claim 1, wherein the one or more computer processors are further configured to reconstruct a motion corrected magnetic resonance image from the magnetic resonance image data using the derived motion corrections.

6. The diagnostic imaging system as claimed in claim 1, the one or more computer processors are further configured to:
control a therapy device to deliver therapy based on at least the motion corrected emission image and the derived motion correction.

7. A diagnostic imaging system comprising:
a magnetic resonance examination system configured to generate magnetic resonance image data and magnetic resonance motion data by performing a magnetic resonance sequence in which spins are excited and encoding gradients are applied to scan k-space to generate the magnetic resonance image data;
an emission tomography system configured to generate nuclear decay data;
a system controller configured to:
control (1) the magnetic resonance examination system and the emission tomography system to generate the magnetic resonance image data and the nuclear decay data simultaneously and (2) the magnetic resonance examination system to repeatedly scan a center strip of k-space to generate the magnetic resonance motion data;
derive motion corrections from the repeated and redundant scans of the center of k-space of the magnetic resonance motion data;
correct the nuclear decay data in accordance with the derived motion correction; and
reconstruct a motion corrected emission tomographic image from the motion corrected nuclear decay data.

8. A diagnostic imaging system comprising:
an emission tomography system configured to receive emission radiation from a subject and generates emission data;
a magnetic resonance system configured to generate magnetic resonance motion data indicative of motion of the object by repeatedly and redundantly scanning a center strip of k-space;
wherein the magnetic resonance system and the emission tomography system are configured to be controlled to generate the emission data and the magnetic resonance motion data concurrently;
one or more computer processors configured to:
analyze the magnetic resonance motion data generated by the repeated and redundant scanning of k-space to generate a signal indicative of the motion of the object,
receive the signal indicative of the motion of the object and the emission data, and
reconstruct a motion corrected emission image.

9. The diagnostic imaging system as claimed in claim 8, wherein the magnetic resonance system is further configured to generate magnetic resonance image data and wherein the one or more computer processors are further configured to receive the magnetic resonance image data and reconstruct a motion corrected magnetic resonance image of the object.

10. A diagnostic imaging method comprising:
with a magnetic resonance imaging system, exciting spins and applying magnetic field encoding gradients to scan k-space to generate magnetic resonance data and to repeatedly and redundantly scan a center strip of k-space to generate magnetic resonance motion data;
generating nuclear decay data with an emission tomography system;
with a system controller, controlling the magnetic resonance examination system and the emission tomography system to simultaneously generate the magnetic resonance image data, the magnetic resonance motion data, and the nuclear decay data;
deriving motion corrections from the repeatedly and redundantly scanned center of k-space; and
correcting the nuclear decay data in accordance with the derived motion correction and reconstructing a motion corrected emission tomographic image.

11. The method according to claim 10, further including:
displaying the motion corrected emission tomographic image on a display device.

* * * * *